United States Patent
Hilder

(10) Patent No.: US 8,130,323 B2
(45) Date of Patent: Mar. 6, 2012

(54) CLOSED LOOP DAC CALIBRATION

(75) Inventor: Brett Hilder, Toronto (CA)

(73) Assignee: ATI Technologies, Inc., Markham, Ontario (CA)

(*) Notice: Subject to any disclaimer, the term of this patent is extended or adjusted under 35 U.S.C. 154(b) by 1107 days.

(21) Appl. No.: 11/847,755

(22) Filed: Aug. 30, 2007

(65) Prior Publication Data

US 2008/0170157 A1 Jul. 17, 2008

Related U.S. Application Data

(60) Provisional application No. 60/823,929, filed on Aug. 30, 2006.

(51) Int. Cl.
*H03M 1/12* (2006.01)
*H03M 1/06* (2006.01)
*H03M 1/10* (2006.01)
*H03M 1/66* (2006.01)

(52) U.S. Cl. ........ 348/572; 341/118; 341/119; 341/120; 341/121; 341/144

(58) Field of Classification Search .................. None
See application file for complete search history.

(56) References Cited

U.S. PATENT DOCUMENTS 6,081,215 A * 6/2000 Kost et al. .................. 341/120

* cited by examiner

*Primary Examiner* — Mark D Featherstone
(74) *Attorney, Agent, or Firm* — Volpe and Koenig, P.C.

(57) ABSTRACT

A video signal processing system including a digital signal processing (DSP) module, a digital offset module coupled to the DSP module, a gain module, and a digital to analog converter (DAC) coupled to the DSP module and to the gain module, wherein the DAC is configured to cause the gain module to provide multiple gain signals having predetermined first values to the DAC, cause, for each of the multiple gain signals, a digital input signal value to the DAC to be ramped up, determine, for each of the multiple gain signals, a lowest digital input signal value that causes an output voltage of the DAC to be at least as high as a reference voltage, and determine a second gain value that will cause the DAC to provide a desired DAC output voltage in response to the DAC receiving a reference DAC input value.

15 Claims, 4 Drawing Sheets

CLOSED LOOP DAC CALIBRATION

RELATED APPLICATIONS

This application claims the benefit of U.S. Provisional Application No. 60/823,929 filed Aug. 30, 2006, which is incorporated by reference herein in its entirety.

BACKGROUND

Today, many forms of information are converted from a digital form to an analog form, such as video information displayed on people's televisions. Thus, an example of such information is digital television (DTV) information. Converting digital information to analog information typically involves the use of a digital-to-analog converter (DAC) contained within a video digital signal processing chip. The input of the DAC is typically coupled to a digital information source, such a digital television feed provided by a cable service provider. The output of the DAC is typically coupled to a display such as a television or a computer monitor. DACs are typically implemented using, among other things, transistors contained within an integrated circuit chip. As the DAC ages, however, performance of the DAC can decrease due to, for example, degradation of n-p junctions contained within the transistors.

DAC operation can also be affected by defects caused during the manufacturing process of the DAC. For example, copper precipitates and pitting are common manufacturing defects. During the manufacturing process of DACs, integrated circuit chips containing a DAC are subjected to a series of diagnostic tests designed to determine if operation of the DAC is within acceptable tolerances. If the operation of the DAC is not within acceptable tolerances, typically the entire chip is discarded. If the DAC is part of a larger digital signal processing (DSP) chip, the costs associated with discarding an entire chip can be substantial.

DACs typically convert an incoming digital signal to an analog signal using multiplication. DACs typically multiply each incoming digital word of a digital signal by a reference voltage and a gain factor. For example, the operation of a DAC can be simplified and represented as:

$$\{DAC\ output\} = (G \times D \times V_{ref})/2^n, \quad (1)$$

where G is a gain factor, D is a digital input word, $V_{ref}$ is a reference voltage, and n is the resolution of the DAC. Alternatively, a reference current can be substituted for the reference voltage.

SUMMARY

In general, in an aspect, implementations of the invention may provide a video signal processing system including a digital signal processing (DSP) module, a digital offset module coupled to the DSP module, a gain module, and a digital to analog converter (DAC) coupled to the DSP module and to the gain module, wherein the DAC is configured to cause the gain module to provide multiple gain signals having predetermined first values to the DAC, cause, for each of the multiple gain signals, a digital input signal value to the DAC to be ramped up, determine, for each of the multiple gain signals, a lowest digital input signal value that causes an output voltage of the DAC to be at least as high as a reference voltage, and determine a second gain value that will cause the DAC to provide a desired DAC output voltage in response to the DAC receiving a reference DAC input value.

Implementations of the invention may provide one or more of the following features. The second gain value includes an integer portion and a non-integer portion. The integer portion of the second gain value is provided to the gain module, and the non-integer portion of the second gain value is provided to the digital offset module. The digital offset module is configured to provide instructions to the DSP module as a function of the value of the non-integer portion of the second gain value. The DSP module is configured to adjust signal processing of a video signal as a function of the instructions provided by the digital offset module. The DAC is configured to determine the second gain value using interpolation. The digital input signal value is ramped up incrementally.

In general, in another aspect, the implementations of the invention may provide a video signal processing method including causing a gain module to provide multiple gain signals having predetermined first values to a digital to analog converter (DAC), causing, for each of the multiple gain signals, a digital input signal value to the DAC to be ramped up, determining, for each of the multiple gain signals, a lowest digital input signal value causing an output voltage of the DAC to be at least as high as a reference voltage, and determining a second gain value that will cause the DAC to provide a desired DAC output voltage in response to the DAC receiving a reference DAC input value.

Implementations of the invention may also provide one or more of the following features. The method further includes providing an integer portion of the second gain value to a gain module, and providing a non-integer portion of the second gain value to a digital offset module. The method further includes providing instructions to a digital signal processing module, from the digital offset module, as a function of the value of the non-integer portion of the second gain value. The method further includes processing a video signal as a function of the instructions provided from the digital offset module. Determining the second gain value includes interpolating. Causing a digital input signal value to the DAC to be ramped up includes incrementally ramping up the digital input signal value.

In general, in another aspect, implementations of the invention provide a computer program product including computer executable instructions that, when executed, cause a computer to cause a gain module to provide multiple gain signals having predetermined first values to a digital to analog converter (DAC), cause, for each of the multiple gain signals, a digital input signal value to the DAC to be ramped up, determine, for each of the multiple gain signals, a lowest digital input signal value causing an output voltage of the DAC to be at least as high as a reference voltage, and determine a second gain value that causes the DAC to provide a desired DAC output voltage in response to the DAC receiving a reference DAC input value.

Implementations of the invention may also provide one or more of the following features. The instructions are further configured to cause the computer to determine an integer portion of the second gain value and to determine a non-integer portion of the second gain value. The instructions are further configured to cause the computer to process a video signal as a function of the non-integer portion of the second gain value. The instructions are further configured to cause the computer to determine the second gain value using interpolation. The instructions are further configured to cause the computer to cause the digital input signal value to the DAC to be ramped up incrementally.

Various aspects of the invention may provide one or more of the following capabilities. DAC calibration precision can be increased compared to prior techniques. Effects of deterioration of the DAC over time can be reduced compared to prior techniques. Defects caused by the manufacturing process of the DAC can be compensated for. Quality of an analog video stream generated by a DAC can be improved compared to prior techniques. Precision of the DAC output is increased compared with prior methods. Variation in end-user signal loads can be compensated for. Non-standard DAC output impedance loads can be compensated for.

These and other capabilities of the invention, along with the invention itself, will be more fully understood after a review of the following figures, detailed description, and claims.

DETAILED DESCRIPTION

Embodiments of the invention provide techniques for providing DAC calibration, and in particular for providing a coarse and a precision calibration for a video DAC. For example, a video processing circuit includes a digital video generation portion and a DAC configured to convert digital video information into analog video information for display. The DAC can be configured to calculate coarse and precision levels of gain adjustment desired for the DAC to operate within desired specifications. The DAC can be configured to calculate the coarse gain adjustment using a known gain value, and simulating an increasing video signal until the output of the DAC meets a desired threshold. The DAC can be configured to repeat this process to obtain several data points. The DAC can be configured to interpolate the precision gain value using the calculated data points and a theoretically perfect forced value. The coarse gain value is used by a gain calibration circuit to provide a coarse gain adjustment value to the DAC. The precision gain value is used by the digital video generation portion to preemptively modify the digital video signal in order to offset imperfection introduced by the DAC. Other embodiments are within the scope of the invention.

Figure 1:
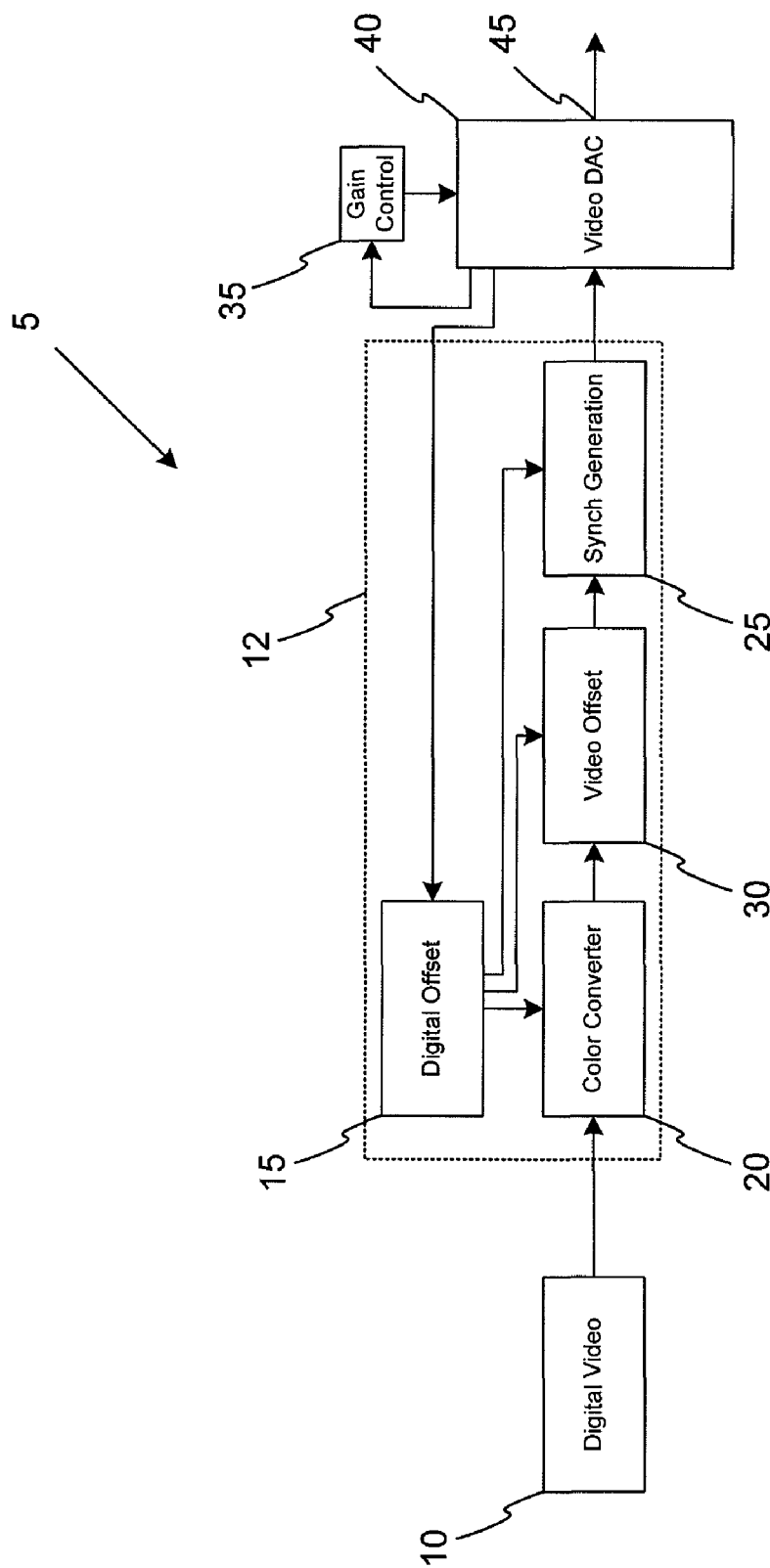
FIG. 1 is a block diagram of a video processing system including a DAC.

Referring to FIG. 1, a digital video processing system 5 (e.g., a digital television) includes a digital video module 10, a signal processing module 12, a gain control 35, and a DAC 40. The video module 10 can be a source of digital video signals (e.g., a graphics processing unit) and/or can be configured to receive a digital video signal from, for example, a cable service provider. Other configurations of the digital video module 10 are possible. The signal processing module 12 is coupled to the digital video module 10 and to the DAC 40. The signal processing module 12 can be configured to receive the digital video signal from the video module 10 and to provide a modified digital video signal to the DAC 40. For example, the signal processing module 12 can change the brightness of the video, change the contrast of the video, change the transmission format from one format to another (e.g., uncompressed video to MPEG-2), can change the color space of the video signal (e.g., RGB to YUV), etc. The DAC 40 is a digital to analog converter system configured to convert the incoming digital signal provided by the signal processing module 12 into an analog signal. The DAC 40 can be configured to output the analog signal via an output 45. The gain control 35 can be configured to receive a signal from the DAC 40 and to provide a four-bit gain adjustment signal to the DAC 40, although other bit-sized signals are possible. The connections coupling the video module 10 and the signal processing module 12, coupling the video processing module 12 and the DAC 45, and coupling the DAC 45 and the gain control 35 can be parallel and/or serial connections.

The signal processing module 12 includes a digital offset module 15, a color converter 20, a synch generation module 25, and a video offset module 30. The digital offset module 15 is coupled to the DAC 40, the color converter 20, the synch generation module 25, and the video offset module 30. The color converter module 20 is further coupled to the digital video module 10 and to the video offset module 30. The synch generation module 25 is further coupled to the video offset module 30 and to the DAC 40. Thus, in the configuration shown in FIG. 1, the digital video signal provided by the digital video module 10 can be processed in series by the color converter 20, the video offset module 30, and the synch generation module 25, respectively, before being provided to the DAC 40, although other configurations are possible. The synch generation module 25 can be configured to provide the digital video signal to the DAC 40. The digital offset module 15 can be configured to receive information from the DAC 40, and to provide information to the color converter 20, to the synch generation module 25, and to the video offset module 30. The digital offset module 15 can be configured to provide control signals used, at least in part, by the color converter module 20, the synch generation module 25 and/or the video offset module 30, if desired.

Each of the color converter module 20, the synch generation module 25, and the video offset module 30 can be configured to use the control signals to provide processing that effectively implements the precision portion of the DAC calibration gain value. For example, each of the color converter module 20, the synch generation module 25, and the video offset module 30 can be configured to receive a signal provided by the digital offset module 15 in order to determine how to process the digital video signal. The processing performed by the color converter module 20, the synch generation module 25, and the video offset module 30 in response to the control signal received from the digital offset module 15 is preferably performed as a function of the precision gain value.

While the color converter 20, the synch generation module 25, and the video offset module 30 are shown as separate modules, other configurations are possible. For example, the color converter 20, the synch generation module 25, and the video offset module 30 can be combined into a single DSP module. Alternatively, other digital signal processing modules can be coupled to the digital offset module 15. For example, other signal processing elements can be added to the DSP module. Furthermore, one or more of the color converter 20, the synch generation module 25, and the video offset module 30 can be omitted if desired.

The color converter 20 can be configured to modify the digital video signal provided by the digital video module 10. The color converter 20 can be configured to perform, for example, gain adjustment, color mapping (e.g., from an RGB color space to a YUV color space), contrast processing, brightness processing, tint processing, color saturation processing, black level processing, and/or color balance processing. The color converter 20 is also configured to provide a gain adjustment to the digital video signal, using, e.g., the signal provided by the DC offset module 15. While the color converter 20 has been described as modifying the digital video signal provided by the digital video module 10, the color converter 20 can be configured not to modify the digital video signal (e.g., passing the digital video signal, unmodified, to the video offset module 30). The color converter 20 can be configured to be controlled, at least partially, using the information provided by the digital offset module 15. For example, the color converter 20 can be configured adjust the brightness, contrast, tint, color saturation, black level, and/or DC offset of the digital video signal provided by the digital video module 10. The color control module 20 can be configured to adjust all color components of a signal, or a portion of the color components present in the digital video signal (e.g., the blue signal in an RGB version of the digital video signal).

The synch generation module 25 and the video offset module 30 can be configured to adjust a DC offset of respective portions of the digital video signal. For example, a high definition television ("HDTV") signal includes several types of information including "active" information (e.g., picture information) and synch information (e.g., information used to synchronize the picture). The synch generation module 25 can be configured to adjust a DC voltage offset level of a synchronization portion of the digital video signal according to, for example, a standard by which the digital video signal is transmitted (e.g., a particular standard may require that the digital video signal be transmitted using a 0.5 VDC offset). The video offset module 30 can be configured to adjust a DC voltage offset level of an active portion of the digital video signal according to, for example, a standard to which the digital video signal is transmitted. Thus, the synch generation module 25 and the video offset module 30 can be configured to perform similar functions (e.g., introducing a DC offset) on different portions of the digital video signal. The synch generation module 25 and the video offset module 30 can be configured to be controlled, at least partially, using the information provided by the digital offset module 15. For example, the synch generation module 25 and the video offset module 30 can be configured to adjust the DC offset of the respective portions of the digital video signal.

Figure 2:
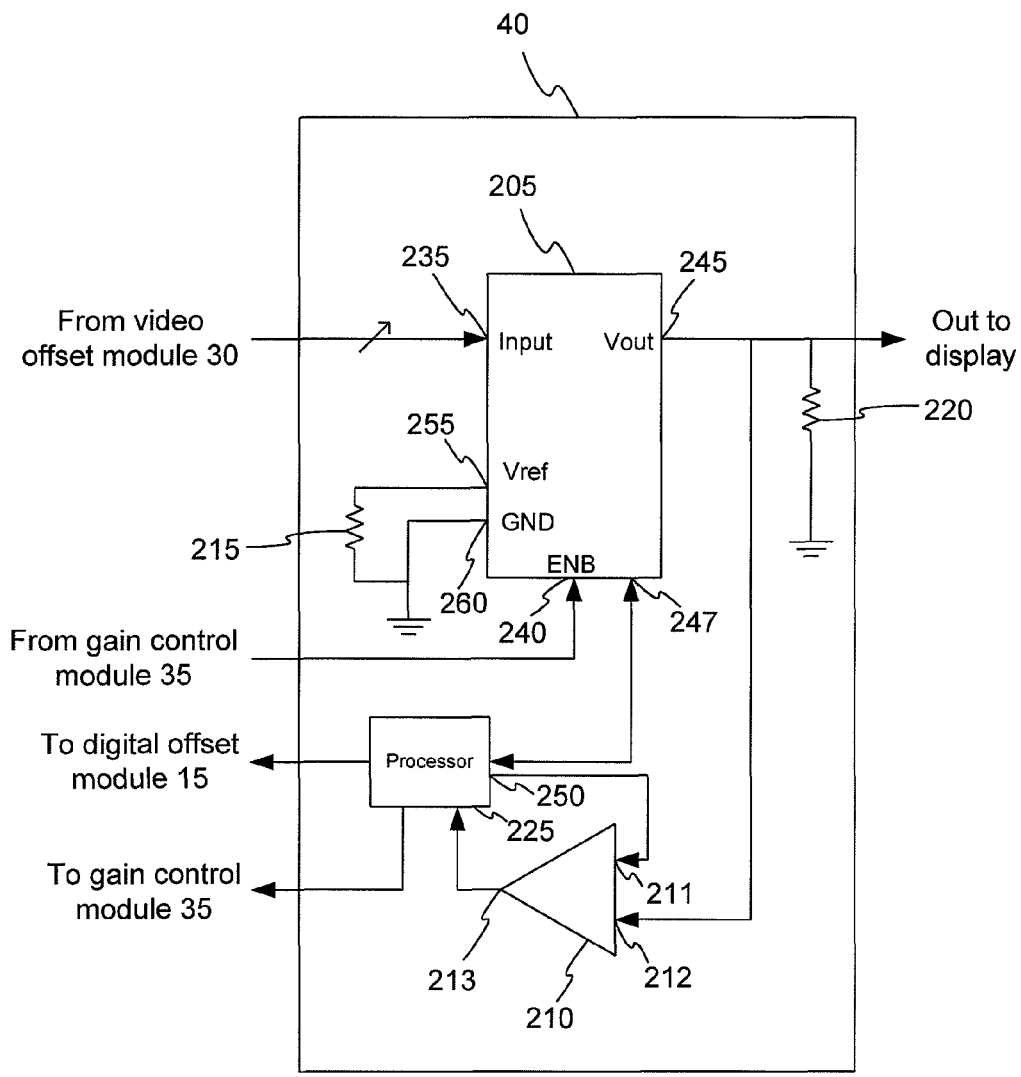
FIG. 2 is a block diagram of the DAC shown in FIG. 1.

Referring also to FIG. 2, the DAC 40 includes a conversion module 205, a comparator 210, resistors 215 and 220, and a processor 225. The conversion module 205 includes connections 235, 240, 245, 247, 255, and 260. The conversion module 205 can be configured to, via the input connection 235, receive the digital video signal from the signal processing module 12. The conversion module 205 can be configured to, via the input connection 235, receive an eight-bit wide parallel data stream from the signal processing module 12, although other connections can be used (e.g., one bit, sixty-four bits, serial, etc.). The conversion module 205 can be configured to, via the enable connection 240, to receive the gain control signal from the gain control 35. The output connection 245 is preferably coupled to an input connection 212 of the comparator 210, a ground via the resistor 220, and to a load (e.g., a display). The conversion module 205 can be configured to provide an analog version of the digital video signal to the display via the output connection 245. For example, the conversion module 205 can be configured to take the input provided via the input connection 235, and the gain signal provided via the enable connection 240, and generate an output according to, e.g., Equation (1). The $V_{ref}$ connection 255 is coupled to a ground via the resistor 215. The configuration of the $V_{ref}$ connection 255 and the resistor 215 enables the DAC 40 to determine its output operating range (e.g., the configuration of the connection $V_{ref}$ 255, the resistor 215, and the ground can function as a calibrated current source). The resistors 215 and 220 are, e.g., 715 Ω and 75 Ω, respectively, although other resistances are possible. The ground connection 260 is coupled to the ground, and provides a ground connection for the conversion module 205. The processor 225 can be configured to monitor the output of the comparator 210 and to provide a signal to the digital offset module 15. The processor 225 is also configured simulate an input at the input connection 235 by, e.g., overriding the digital video signal, if present, on the input connection 235 with a forced digital reference signal provided via the input connection 247.

The system 5 can be configured to correct for degradation and/or defects in the conversion module 205 by performing a calibration sequence. The conversion module 205 can be configured such that given a specific input (e.g., the forced digital reference signal provided from the processor 225 and a known gain value), a single specific corresponding output should result. As the conversion module 5 ages, however, the output produced by the conversion module 205 corresponding to the forced digital reference signal can change due to degradation in, for example, the n-p junctions of the transistors contained within the conversion module 205. For example, as the conversion module 205 ages, a voltage of the analog output signal generated by the conversion module 205 in response to the forced digital reference signal may decrease. Likewise, two brand new conversion modules 205 may each provide a different analog output in response to the forced digital reference signal due to manufacturing differences. The system 5 can be configured to calibrate the conversion module 205 to compensate for manufacturing differences and/or aging of the conversion module 205.

The system 5 can be configured to provide two-stage calibration (e.g., coarse and precision calibration) using the gain control module 35 and digital offset module 15. The signal provided by the gain control 35 to the conversion module 205 is a digital signal that includes integer values, thus providing coarse calibration. For example, when using a four-bit gain control signal provided by the gain control 35, the gain control signal can be one of 16 values (e.g., 0 through 15) corresponding to 16 coarse calibration values. If however, the desired amount of gain correction is not an integer value (e.g., 7.5), precision calibration can be provided by the digital offset module 15 to provide for the non-integer calibration portion of gain correction.

The DAC 40 can be configured to perform coarse calibration during a calibration phase, e.g., at startup of the system 5, using the gain control 35, the comparator 210, and the processor 225. The processor 225 can be configured to calculate several pairs of a gain control signal values and forced digital reference signal values. For example, referring also to FIG. 3, data points 305, 310, 315, and 320 each correspond to specific pairs of forced digital reference signal values and gain control signal values.

The DAC 40 can be configured to calculate the data points 305, 310, 315, and 320 using the gain control 35, the conversion module 205, the comparator 210, and the processor 225. The processor 225 can be configured such that it provides a control signal to the gain control 35, thereby causing the gain control 35 to provide the gain control signal (e.g., six, corresponding to the data point 305) to the conversion module 205 via the enable connection 240. The processor 225 is also configured to set input registers contained within the conversion module 205 (which are normally responsible for receiving and storing the incoming digital video signal from the signal processing module 12) to represent the known forced digital reference signal. In effect, the processor 225 can be configured to simulate an incoming digital video signal of a known value by controlling information stored in the registers of the conversion module 205. The processor 225, via an output connection 250, can be configured provide an analog reference signal, here a known voltage, to a reference input connection 211 of the comparator 210. The analog reference signal represents, for example, the ideal output level of the conversion module 205 that corresponds to the gain control value and the simulated input provided to the conversion module 205. The processor 225 can be configured such that it can be tuned/calibrated thereby preserving the integrity of the analog reference signal as a known, predetermined analog signal.

The processor 225 can be configured to determine the digital signal reference value corresponding to each of the gain control signal values by gradually increasing (e.g., ramping-up) the value of the digital signal reference until the comparator 210 "trips." The processor 225 can be configured to provide a forced digital reference signal to the conversion module 205 by, for example, storing the appropriate information in the registers of the conversion module 205. The conversion module 205 can be configured to convert the forced digital reference signal into an analog signal that is provided to the input connection 212 of the comparator 210 via the output connection 245. The comparator 210 can be configured to output a signal (e.g., a binary zero) indicating that the output of the conversion module 205 is less than the analog reference signal provided to the comparator 210 via the reference input connection 211. Likewise, the comparator 210 can be configured to output a signal (e.g., a binary one) indicating that the output of the conversion module 205 from output connection 235 is equal to, or greater than the analog reference signal provided to the reference input connection 211 of the comparator 210. The processor 225 can be configured to determine the forced digital reference signal value corresponding to the gain control value provided to the conversion module 205 by increasing the forced digital reference signal value until the comparator 210 trips, thus indicating that the output of the conversion module 205 is equal to, or greater than the analog reference signal on the reference input connection 211. The processor 225 can be configured to determine a forced digital reference signal value corresponding to all, or a sub-set of all of the possible gain control signal values.

During manufacture of the DAC 40 a theoretically perfect forced data value is calculated that corresponds to the conversion module 205. The theoretically perfect forced data value is a function of the physical design of the conversion module 205, and will typically remain the same throughout the life of the conversion module 205, although other configurations are possible. The theoretically perfect forced data value corresponds to the input (e.g., the digital word) which should be provided to the conversion module 205 in order for $V_{ref}$ to result at the output connection 235 when, e.g., a gain of one is provided to the conversion module 205 and $V_{ref}$ is present at the $V_{ref}$ connection 255.

Figure 3:
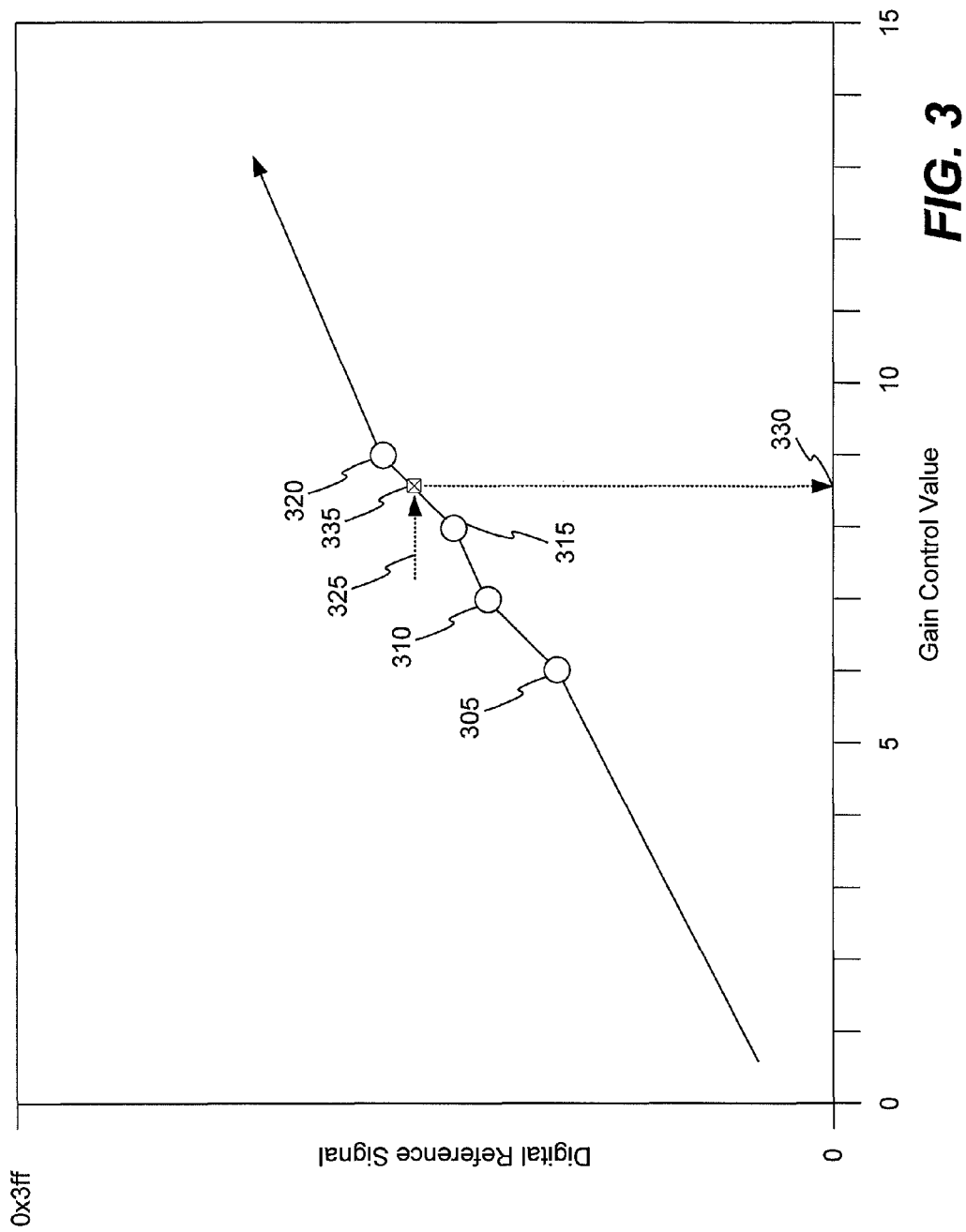
FIG. 3 is a graph illustrating pairs of forced digital reference signals and corresponding gain control values.

The DAC 40 is further configured to perform precision calibration during the calibration phase. The processor 225 can be configured to calculate a gain control value corresponding to the theoretically perfect forced value (e.g., such that $V_{ref}$ results at the output connection 235). For example, the processor 225 is configured to determine the precise gain value that will cause the DAC 40 to convert the theoretically perfect value (received at the input connection 235) to an output of $V_{ref}$ at the output 245. A theoretically perfect forced value 325 is shown in FIG. 3. The theoretically perfect forced value 325 has a corresponding gain control value 330 indicated by point 335. The processor 225 can be configured to calculate the gain control value 330 corresponding to the theoretically perfect value 325 using bilinear interpolation and gain control values of the surrounding data points (e.g., the data points 315 and 320 in FIG. 3). While bilinear interpolation using two data points has been described, other methods of estimation and/or interpolation can be used. For example, bicubic interpolation using more than two data points can be used to interpolate the corresponding gain control value 330. The DAC 40 can be configured such that it outputs interpolated corresponding gain control values including an integer portion and a non-integer portion.

The processor 225 can be configured to use the interpolated gain control value 330 to generate instructions that are provided to the digital offset module 15 and the gain control 35. The processor 225 can be configured to provide the integer portion of the gain control value 330 to the gain control 35, and the non-integer portion of the gain control value 330 to the digital offset module 15. For example, referring to FIG. 3, the gain control value 330 is about 8.65. The processor 225 can be configured to instruct the gain control 35 to provide a coarse gain control value of 8.0 to the conversion module 205. The processor 225 is further configured to provide a signal to the digital offset module 15 indicating that a gain correction of about 0.65 is desired.

The digital offset module 15 can be configured to receive the non-integer portion of the gain control value 330 and to provide a signal to the color converter 20, the synch generation module 25, and/or the video offset module 30. The digital offset module 15 can be configured to use, for example, look-up tables to determine the appropriate signals to provide to the color converter 20, the synch generation module 25, and/or the video offset module 30, respectively. For example, using the look-up tables, the digital offset module 15 can determine an amount of color correction, synch DC offset, and/or active DC offset corresponding to a gain control value of 0.65. By intentionally altering the digital video signal prior to its conversion by the DAC 40, the system 5 can provide precision calibration. For example, if 0.65 worth of gain control indicates that the DAC 40 is converting the digital video signal two units of contrast too low, the color control converter 20 can be configured to intentionally boost the digital video signal by two units of contrast (e.g., digital gain). While the digital offset module 15 has been described as using look-up tables, other configurations are possible, e.g., numerical calculation can be used instead of a look-up table.

Figure 4:
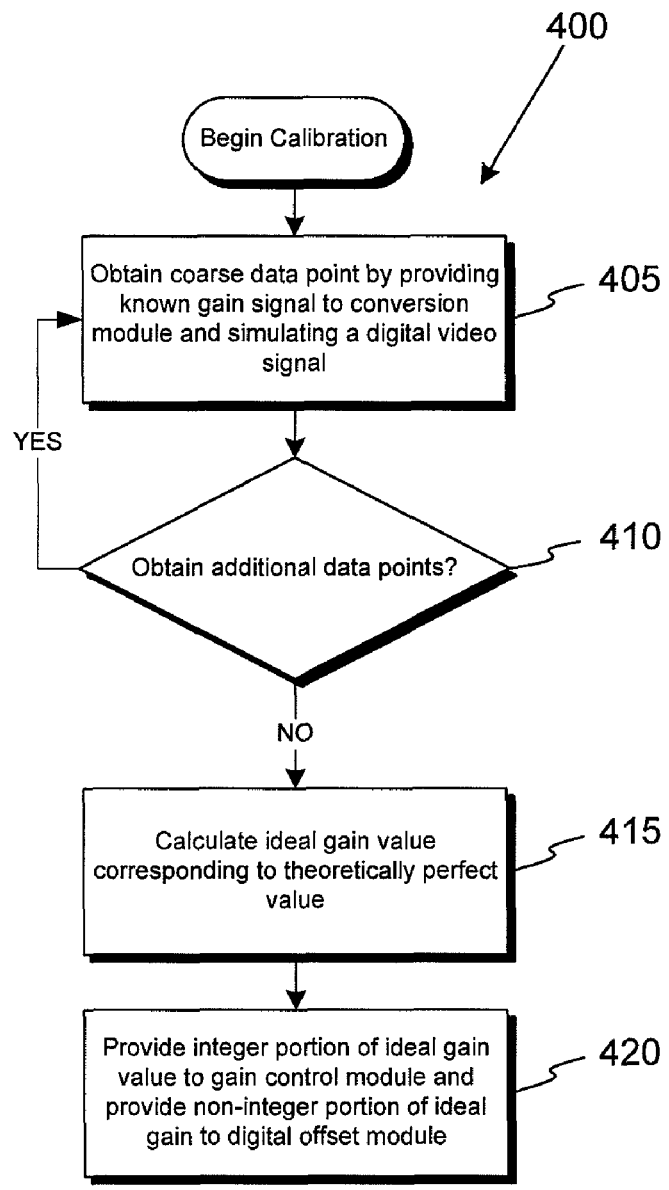
FIG. 4 is a flowchart of a process of providing precision calibration of the DAC shown in FIG. 1.

In operation, referring to FIG. 4, with further reference to FIGS. 1-3, a process 400 for DAC calibration using the system 5 includes the stages shown. The process 400, however, is exemplary only and not limiting. The process 400 may be altered, e.g., by having stages added, removed, or rearranged. The process 400 can be performed at various times during the life of a display. For example, the process 400 can be performed each time the display is turned on, periodically (e.g., once a month, once a year, every hour), upon a command at random (e.g., by a user's request), etc.

At stage 405, the processor 225 obtains a data point including a gain value and a corresponding data reference signal value. To obtain the data point, the processor 225 causes the gain control 35 to provide a known gain value to the conversion module 205 via the enable connection 240. The processor 225 also provides the analog reference signal, via the output connection 250, to the reference input connection 211 of the comparator 210. The processor 225 provides a forced digital reference signal to the input 247 of the conversion module 205 (e.g., the processor 225 simulates an input to the input connection 235 of the conversion module 205 by overriding the input registers coupled to the input connection 235, using the input connection 247). The conversion module 205 uses the gain indicated by the gain control value to convert the forced digital reference signal into an analog signal, which is provided to the input connection 212 of the comparator 210 via the output connection 235. The forced digital reference signal simulated by the processor 225 is increased until the comparator 210 trips (i.e., the signal provided at the input connection 212 of the comparator 210 is equal to, or greater than the input provided at the reference input connection 211 of the comparator 210). The data point is obtained by recording the value of the simulated signal and the gain value when the comparator trips.

At stage 410, the processor 225 determines whether to collect more than a single data point. If additional data points are desired, the process 400 proceeds to stage 405. If no additional data points are desired, the process 400 proceeds to stage 415. This can depend on, for example, the estimation method used by the processor 225 to determine the precision gain value.

At stage 415, the processor 225 determines a precision gain value using the theoretically perfect value and the data points collected during stages 405 and 410. The processor 225 preferably uses at least two of the data points collected during stages 405 and 410 and bilinear interpolation to calculate an ideal gain control value corresponding to the theoretically perfect value. Preferably, the processor 225 calculates the interpolated ideal gain value to two decimal places, although more or fewer decimal places can be used.

At stage 420, the processor 225 provides the integer portion of the interpolated ideal gain value to the gain control 35 and provides the non-integer portion of the interpolated ideal gain value to the digital offset module 15. The processor 225 causes the gain control 35 to provide a gain value to the conversion module 205 corresponding to the integer portion of the interpolated ideal gain value. The digital offset module 15 receives the non-integer portion of the interpolated ideal gain value and provides control signals to the color converter 20, the synch generation module 25, and/or the video offset module 30. The digital offset module 15 determines which signals to provide to the color converter 20, the synch generation module 25, and/or the video offset module 30 using the signal provided by the processor 225 (e.g., the non-integer portion of the interpolated ideal gain value) and a look-up table and/or numerical calculation. The color converter 20, the synch generation module 25, and/or the video offset module 30 use (at least in part) the information provided by the digital offset module 15 to process a video signal provided by the digital video module 10, and provide the processed signal to the DAC 40.

Other embodiments are within the scope and spirit of the invention. For example, due to the nature of software, functions described above can be implemented using software, hardware, firmware, hardwiring, or combinations of any of these. Features implementing functions may also be physically located at various positions, including being distributed such that portions of functions are implemented at different physical locations. For example, the processor 225 can be part of the conversion module 205; the processor 225 can provide the forced digital reference signal to the input connection 235 of the conversion module 205 instead of simulating an input by overriding the input registers; the gain control 35 can be contained within the DAC 40 and/or within the conversion module 205; the functionality provided by the color converter 20, the synch generation module 25 and/or the video offset module 30 can be combined into a single component.

Furthermore, while the description above refers to the invention, the description may include more than one invention.

What is claimed is:

1. A video signal processing system comprising:
a digital signal processing (DSP) module including a digital offset module;
a gain module; and
a digital to analog converter (DAC) coupled to the DSP module and to the gain module, wherein the DAC is configured to:
cause the gain module to provide multiple gain control signals having predetermined first values to the DAC;
cause, for each of the first values of the multiple gain control signals, a digital input signal value to the DAC to be ramped up;
determine, for each of the first values of the multiple gain control signals, a lowest digital input signal value, in response to being ramped up, that causes an output voltage of the DAC to be at least as high as a reference voltage; and
determine, based on the determined digital input signal values and corresponding first values of the multiple gain control signals, a second gain control signal value suitable for calibration of the DAC, such that the second gain control value causes the DAC to provide a desired DAC output voltage in response to the DAC receiving a reference DAC input value, wherein each pair of determined digital input signal value and corresponding first value of the multiple gain control signal defines a data point having a linear relationship with any of the other data points, wherein the DAC is configured to determine the second gain control signal value using interpolation of the data points.

2. The system of claim 1 wherein the second gain control signal value includes an integer portion and a non-integer portion.

3. The system of claim 1 wherein the digital input signal value is ramped up incrementally.

4. The system of claim 2 wherein the integer portion of the second gain control signal value is provided to the gain module, and the non-integer portion of the second gain control signal value is provided to the digital offset module.

5. The system of claim 4 wherein the digital offset module is configured to provide instructions to the DSP module as a function of the value of the non-integer portion of the second gain control signal value.

6. The system of claim 5 wherein the DSP module is configured to adjust signal processing of a video signal, prior to digital-to-analog conversion of the video signal by the DAC, as a function of the instructions provided by the digital offset module.

7. A video signal processing method comprising:
causing a gain module to provide multiple gain control signals having predetermined first values to a digital to analog converter (DAC);
causing, for each of the first values of the multiple gain control signals, a digital input signal value to the DAC to be ramped up;
determining, for each of the first values of the multiple gain control signals, a lowest digital input signal value, in response to being ramped up, that causes an output voltage of the DAC to be at least as high as a reference voltage; and
determining, based on the determined digital input signal values and corresponding first values of the multiple gain control signals, a second gain control signal value suitable for calibration of the DAC, such that the second gain control value causes the DAC to provide a desired DAC output voltage in response to the DAC receiving a reference DAC input value, wherein each pair of determined digital input signal value and corresponding first value of the multiple gain control signal defines a data point having a linear relationship with any of the other data points, wherein determining the second gain control signal value includes interpolation of the data points.

8. The method of claim 7 further comprising providing an integer portion of the second gain control signal value to a gain module, and providing a non-integer portion of the second gain control signal value to a digital offset module.

9. The method of claim 7 wherein causing a digital input signal value to the DAC to be ramped up includes incrementally ramping up the digital input signal value.

10. The method of claim 8 further comprising providing instructions to a digital signal processing module, from the digital offset module, as a function of the value of the non-integer portion of the second gain control signal value.

11. The method of claim 10 further comprising:
adjusting processing of a video signal as a function of the instructions provided from the digital offset module, where the processing of the video signal is performed prior to digital-to-analog conversion by the DAC.

12. A non-transitory computer readable medium programmed with computer executable instructions that, when executed, cause a computer to:
cause a gain module to provide multiple gain control signals having predetermined first values to a digital to analog converter (DAC);
cause, for each of the first values of the multiple gain control signals, a digital input signal value to the DAC to be ramped up;
determine, for each of the first values of the multiple gain control signals, a lowest digital input signal value, in response to being ramped up, that causes an output voltage of the DAC to be at least as high as a reference voltage; and
determine, based on the determined digital input signal values and corresponding first values of the multiple gain control signals, a second gain control signal value suitable for calibration of the DAC, such that the second gain control value causes the DAC to provide a desired DAC output voltage in response to the DAC receiving a reference DAC input value, wherein each pair of predetermined digital input signal value and corresponding first value of the multiple gain control signal defines a data point having a linear relationship with any of the other data points, wherein the instructions are further configured to cause the computer to determine the second gain control signal value using interpolation of the data points.

13. The non-transitory computer readable medium of claim 12, wherein the instructions are further configured to cause the computer to determine an integer portion of the second gain control signal value and to determine a non-integer portion of the second gain value.

14. The non-transitory computer readable medium of claim 12, wherein the instructions are further configured to cause the computer to cause the digital input signal value to the DAC to be ramped up incrementally.

15. The non-transitory computer readable medium of claim 13, wherein the instructions are further configured to cause the computer to process a video signal as a function of the non-integer portion of the second gain control signal value.

* * * * *